US012787712B2

(12) United States Patent
Shin

(10) Patent No.: US 12,787,712 B2
(45) Date of Patent: Nov. 3, 2026

(54) TRANSPORT HAND AND RING TRANSPORT SYSTEM USING THE SAME

(71) Applicant: SEMES CO., LTD., Cheonan-si (KR)

(72) Inventor: Jae Won Shin, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 797 days.

(21) Appl. No.: 18/135,138

(22) Filed: Apr. 15, 2023

(65) Prior Publication Data

US 2023/0352335 A1 Nov. 2, 2023

(30) Foreign Application Priority Data

May 2, 2022 (KR) ........................ 10-2022-0054338

(51) Int. Cl.
*H10P 72/78* (2026.01)
*H10P 72/76* (2026.01)

(52) U.S. Cl.
CPC .......... *H10P 72/78* (2026.01); *H10P 72/7602* (2026.01)

(58) Field of Classification Search
CPC ...... H10P 72/10; H10P 72/78; H10P 72/3202; H10P 72/3302; H10P 72/7602; B25J 11/0095; B25J 15/0014; B25J 15/0683
See application file for complete search history.

(56) References Cited

U.S. PATENT DOCUMENTS 11,112,773 B2 9/2021 Trussell et al.
2015/0008688 A1* 1/2015 Furuichi .............. B25J 15/0683 294/183
2015/0008689 A1* 1/2015 Shin ..................... B25J 15/0616 294/183
2015/0008690 A1* 1/2015 Kobuchi .............. B25J 15/0683 294/183
2015/0008691 A1* 1/2015 Furuichi .............. B25J 15/0683 294/189
2016/0254176 A1* 9/2016 Monaco .................. H10P 72/78 294/188

(Continued)

FOREIGN PATENT DOCUMENTS

CN 114078731 2/2022
JP 2014-050940 3/2014

(Continued)

OTHER PUBLICATIONS

Office Action from Korean Intellectual Property Office dated Dec. 26, 2023.

*Primary Examiner* — Sang K Kim

(57) ABSTRACT

Proposed is a transport hand and a ring transport system using the same and, more particularly, to a transport hand and a ring transport system using the same with an improved structure to prevent a ring from being separated from a ring carrier during a ring transport process by temporarily fixing the ring using vacuum adsorption. The transport hand includes a support pad coupled to the upper surface to contact a wafer or ring carrier, a wafer adsorption means configured to provide adsorption force to the wafer disposed on the upper surface, and include a first upper surface hole, a first lower surface hole, and a first passage, and a ring carrier adsorption means configured to provide adsorption force to the ring carrier disposed on the upper surface, and include a second upper surface hole, a second lower surface hole, and a second passage.

20 Claims, 7 Drawing Sheets

(56) References Cited

U.S. PATENT DOCUMENTS

| | | | |
|---|---|---|---|
| 2018/0065257 | A1* | 3/2018 | Iwasaka ............... B25J 15/0683 |
| 2020/0035470 | A1 | 1/2020 | Ishizawa |
| 2020/0273681 | A1 | 8/2020 | Son et al. |
| 2021/0217594 | A1 | 7/2021 | Son et al. |
| 2022/0051928 | A1 | 2/2022 | Amikura et al. |
| 2025/0066940 | A1 | 2/2025 | Sridhar et al. |

FOREIGN PATENT DOCUMENTS

| | | |
|---|---|---|
| KR | 10-2017-0054253 | 5/2017 |
| KR | 10-2020-0078774 | 7/2020 |
| KR | 10-2174063 | 7/2020 |
| KR | 10-2020-0102612 | 9/2020 |
| KR | 10-2021-0030917 | 3/2021 |
| KR | 10-2250215 | 5/2021 |
| KR | 10-2022-022445 | 2/2022 |

* cited by examiner

TRANSPORT HAND AND RING TRANSPORT SYSTEM USING THE SAME

CROSS REFERENCE TO RELATED APPLICATION

The present application claims priority to Korean Patent Application No. 10-2022-0054338, filed on May 2, 2022, the entire contents of which is incorporated by reference herein for all purposes.

BACKGROUND OF THE INVENTION

Field of the Invention

The present disclosure relates to a transport hand and a ring transport system using the same and, more particularly, to a transport hand and a ring transport system using the same with an improved structure to prevent a ring from being separated from a ring carrier during a ring transport process by temporarily fixing the ring using vacuum adsorption.

Description of the Related Art

In the semiconductor manufacturing process, transport arms are used when transferring wafers from storage areas such as FOUPs to process chambers, or from process chambers to process chambers.

The process system includes a process chamber in which several processes are performed, and gas is sometimes used to etch objects in the process chamber. At this time, a process kit ring covers an object to protect all or part of the object or chamber. For example, an annular edge ring is disposed on the outer diameter of the object to protect the surface of an electrostatic chuck (ESC) supporting the object while the object is being etched.

When transferring such a ring, a configuration called a ring carrier is used. The ring carrier is placed between the ring and a robot arm to support the ring when transferring the ring. Yet, since conventional ring carriers do not include a configuration for temporarily fixing a ring, and the ring is temporarily fixed only by the frictional force between the ring and the ring carrier, the ring may move or escape from the ring carrier during the transfer process, which is problematic.

SUMMARY OF THE INVENTION

Accordingly, the present disclosure has been made keeping in mind the above problems occurring in the related art, and the present disclosure is intended to provide a transport hand and a ring transport system using the same, capable of preemptively preventing the possibility of a ring being separated from a ring carrier in the process of transferring the ring.

In order to achieve the above objective, according to an embodiment of the present disclosure, there is provided a transport hand for a transport system in a shape of a plate having an upper surface in contact with a wafer or ring carrier to transfer the wafer or ring carrier. The transport hand includes: a support pad coupled to the upper surface to contact the wafer or ring carrier; a wafer adsorption means configured to provide adsorption force to the wafer disposed on the upper surface, the wafer adsorption means comprising a first upper surface hole, which is a hole formed through the upper surface, a first lower surface hole formed through a lower surface opposite to the upper surface, and a first passage having a first end connected to the first upper surface hole and a second end connected to the first lower surface hole; and a ring carrier adsorption means configured to provide adsorption force to a ring carrier disposed on the upper surface, the ring carrier adsorption means comprising a second upper surface hole, which is a hole formed through the upper surface, a second lower surface hole formed through the lower surface opposite to the upper surface, and a second passage having a first end connected to the second upper surface hole and a second end connected to the second lower surface hole.

Preferably, the support pad is installed in a portion where the first upper surface hole is located, and has a hole communicating with the first upper surface hole.

Preferably, the support pad is installed in a portion where the second upper surface hole is located, and has a hole communicating with the second upper surface hole.

In order to achieve the above objective, according to an embodiment of the present disclosure, there is provided a ring transport system, including: the transport hand of claim 1; a ring carrier configured in a shape of a disk, and configured to have a lower surface in contact with the transport hand and an upper surface on which a ring support pad is installed to transport a ring while in contact with the ring by the ring support pad, the ring carrier comprising a first vacuum hole, which is a hole formed through the upper surface, a second vacuum hole, which is a hole formed through the lower surface, and a carrier passage connecting the first vacuum hole and the second vacuum hole to each other; a transport arm configured to drive the transport hand; and an air suction means connected to the first lower surface hole and the second lower surface hole to suck air through a path of the first upper surface hole, first passage, and first lower surface hole or a path of the second upper surface hole, second passage, and second lower surface hole.

Preferably, the second vacuum hole is provided at a position capable of communicating with the second upper surface hole formed on the transport hand.

Preferably, the first vacuum hole includes a plurality of first vacuum holes.

Preferably, the carrier passage includes: a first carrier passage connecting the second vacuum hole and any one of the first vacuum holes to each other; and a second carrier passage formed in a circular shape under a rim of the upper surface to connect all of the first vacuum holes to each other.

Preferably, the carrier passage connects the second vacuum hole and the individual first vacuum holes to each other.

Preferably, the number of the first vacuum holes is N, a contained angle between a pair of the first vacuum holes adjacent to a center of the upper surface is 360/N degrees.

Preferably, the ring support pad is installed in a portion where the first vacuum hole is located, and has a hole communicating with the first vacuum hole.

As described above, according to a transport hand and a ring transport system using the same of the present disclosure, the possibility of a ring being separated from a ring carrier in the process of transferring the ring can be prevented.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, specific details for carrying out the present disclosure will be provided by describing an end effector and a ring carrier using the same according to an embodiment of the present disclosure with reference to the accompanying drawings.

Figure 1:
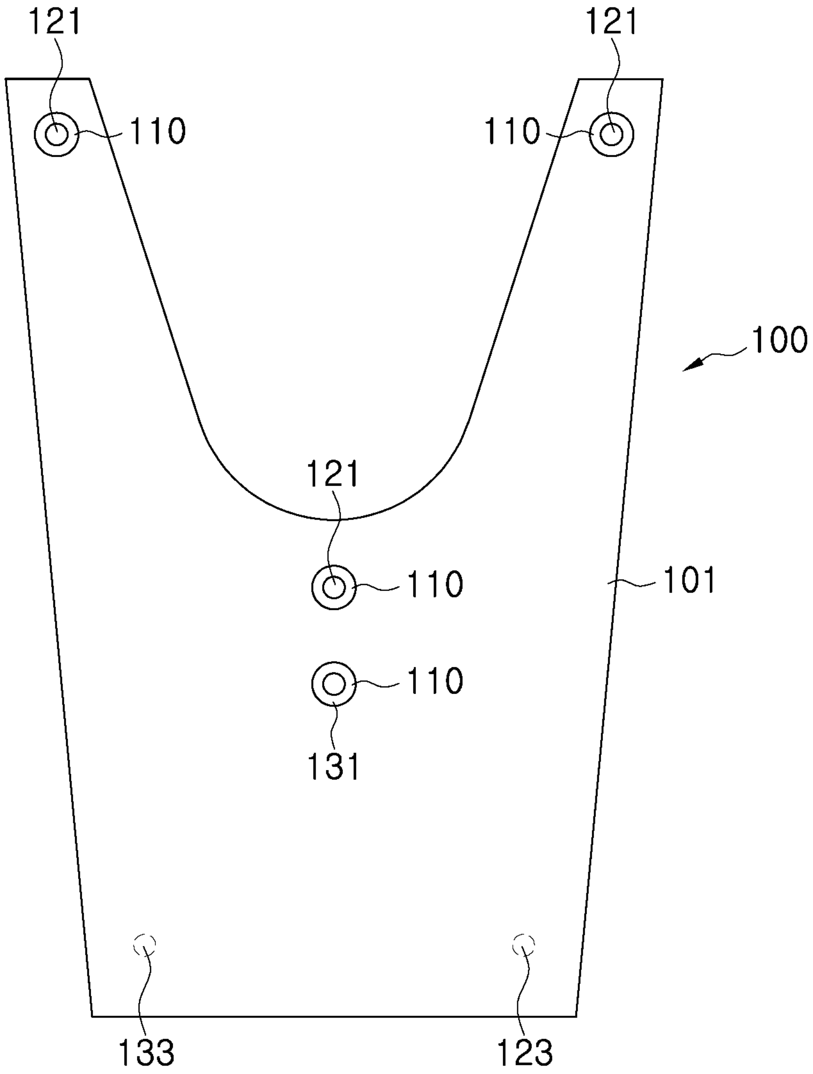
FIG. 1 is a plan view of a transport hand according to an embodiment of the present disclosure.
Figure 2:
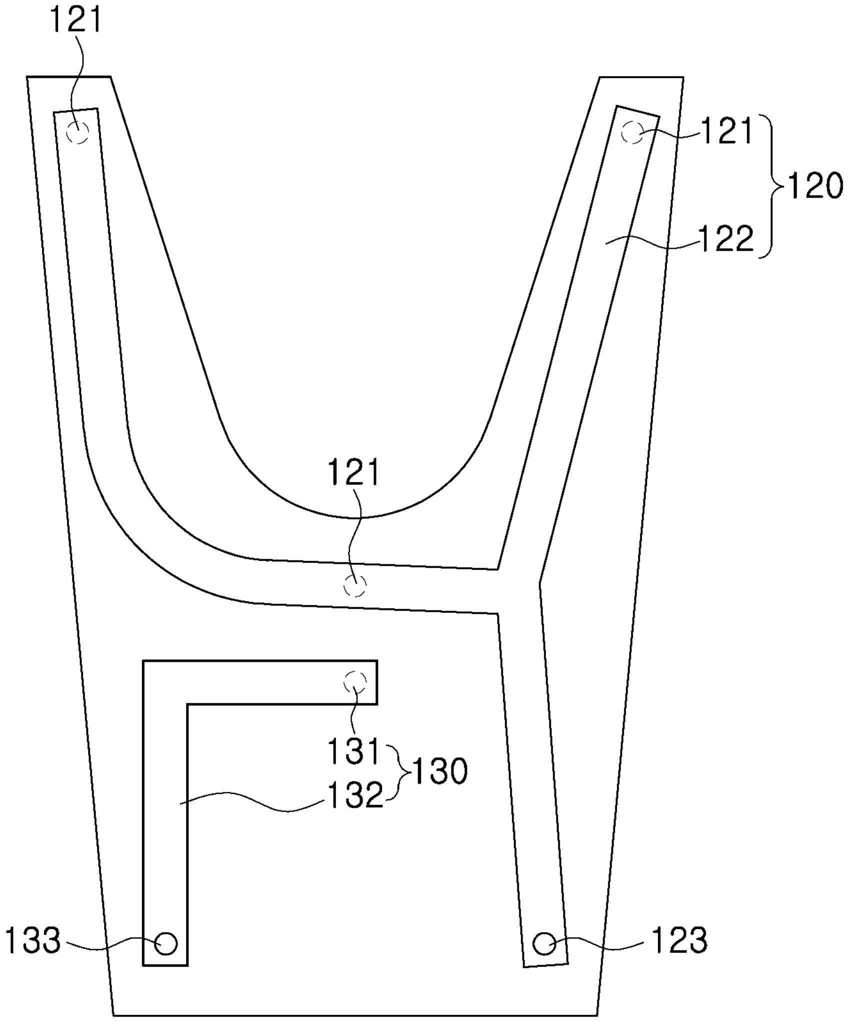
FIG. 2 is a cross-sectional view of the transport hand shown in FIG. 1.
Figure 3:
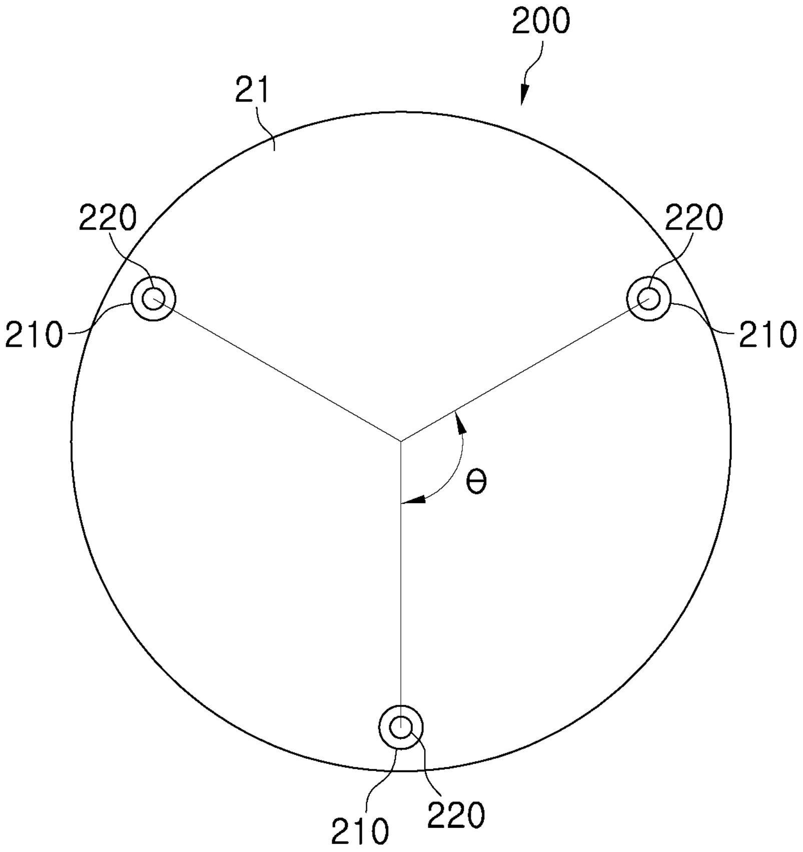
FIG. 3 is a plan view of a ring carrier of a ring transport system according to an embodiment of the present disclosure.
Figure 4A:
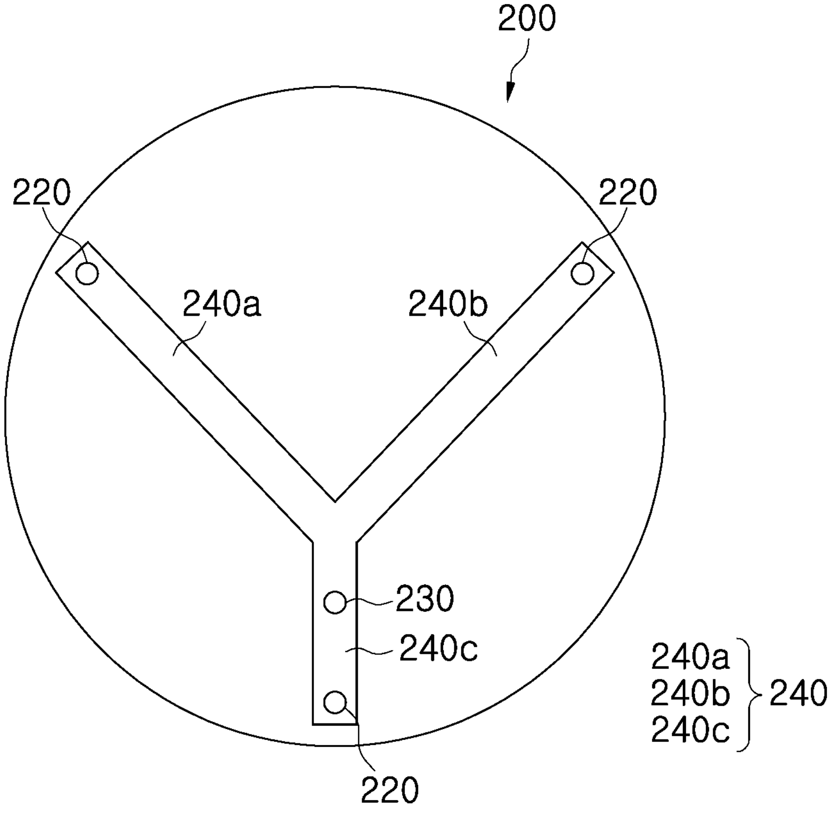
FIGS. 4A and 4B are cross-sectional views of the ring carrier shown in FIG. 3.
Figure 4B:
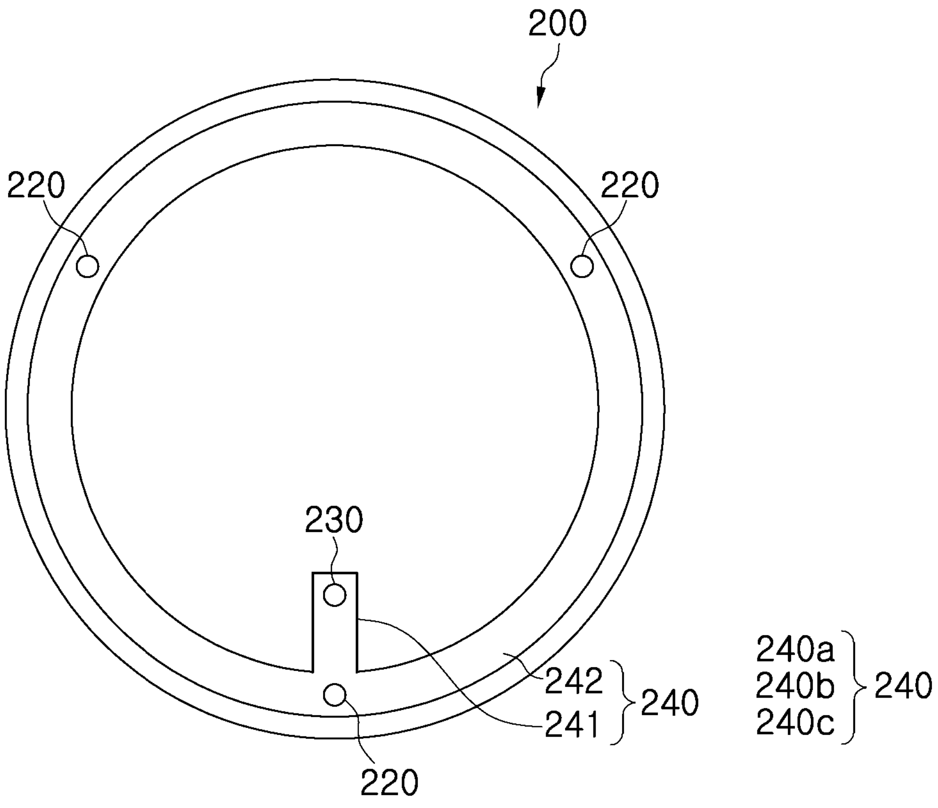
Figure 5:
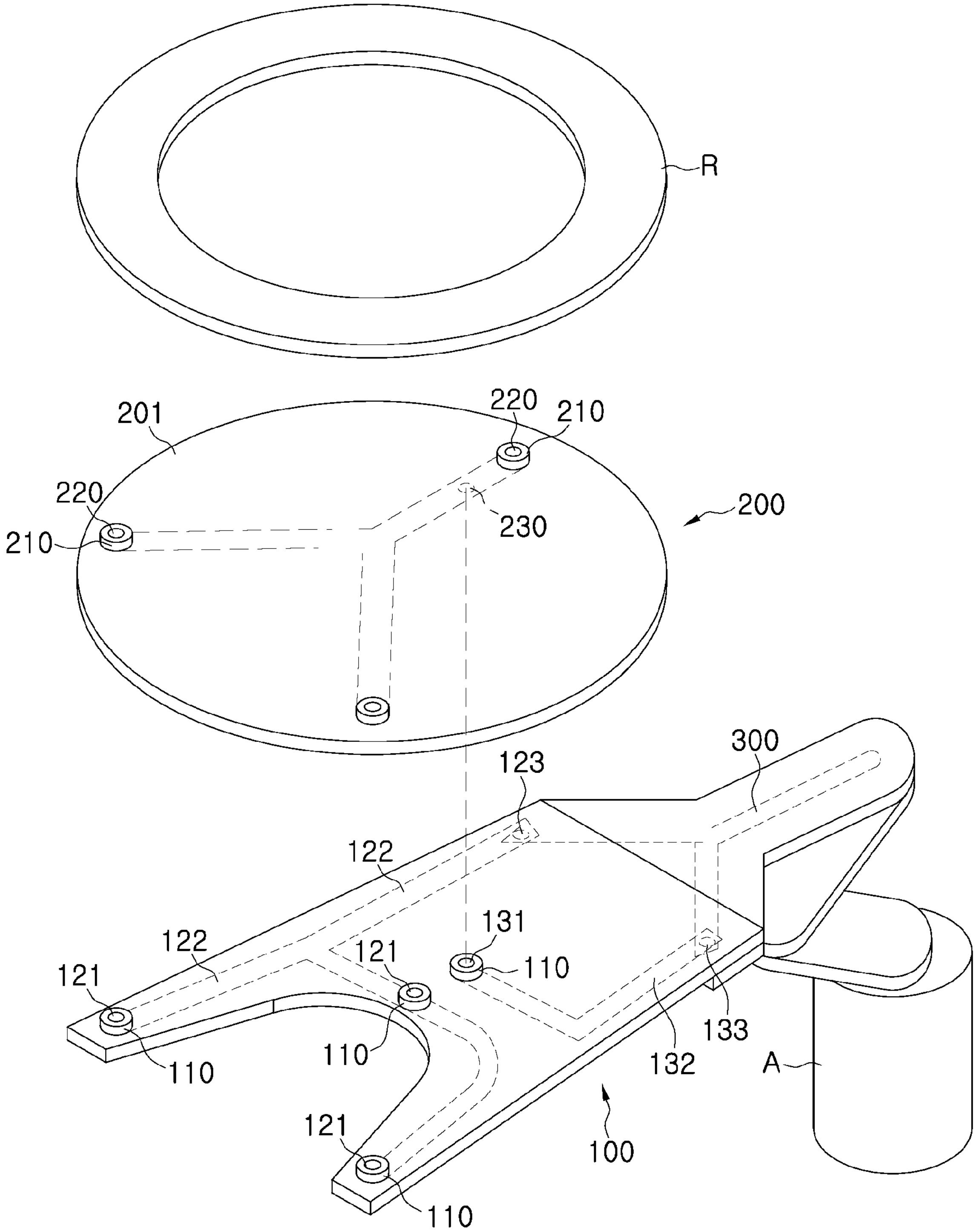
FIG. 5 is a plan view of a ring carrier of a ring transport system according to an embodiment of the present disclosure.
Figure 6:
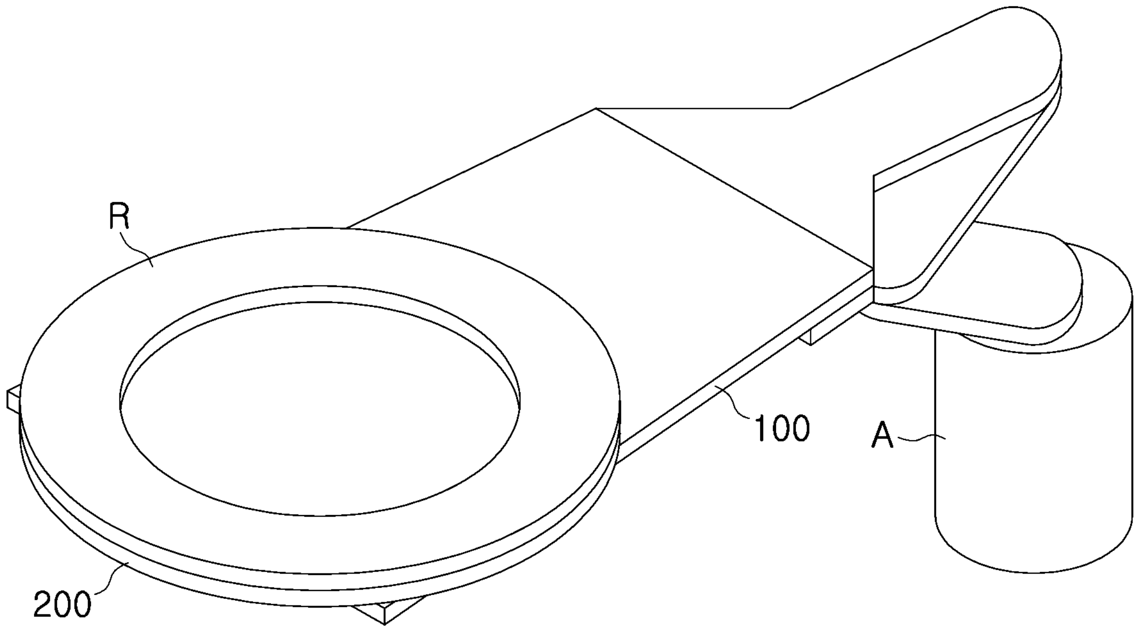
FIG. 6 is an assembled perspective view of a ring, the ring carrier, and a transport hand shown in FIG. 5.

FIG. 1 is a plan view of a transport hand according to an embodiment of the present disclosure; FIG. 2 is a cross-sectional view of the transport hand shown in FIG. 1; FIG. 3 is a plan view of a ring carrier of a ring transport system according to an embodiment of the present disclosure; FIGS. 4A and 4B are cross-sectional views of the ring carrier shown in FIG. 3; FIG. 5 is a plan view of a ring carrier of a ring transport system according to an embodiment of the present disclosure; and FIG. 6 is an assembled perspective view of a ring, the ring carrier, and a transport hand shown in FIG. 5.

First, a transport hand, which is the first aspect of the present disclosure, will be described.

A transport hand 100 according to an embodiment of the present disclosure has a plate-shaped configuration and includes an upper surface 101 and a lower surface. As shown in FIGS. 1 and 2, the transport hand 100 is provided with a support pad 110, a wafer adsorption means 120, and a ring carrier adsorption means 130. The upper surface 101 and the lower surface are not names that refer to the upper surface and the lower surface, respectively, as the meaning of the word implies. This is because the upper and lower surfaces may be different if the transport hand 100 is flipped. The upper surface 101 of the transport hand 100 is the surface in contact with a wafer or ring, and the lower surface is the surface opposite to the upper surface.

The support pad 110 is a friction member coupled to the upper surface 101 and in contact with the wafer or ring carrier. Since the support pad 110 is in direct contact with a wafer or ring carrier, the support pad 110 is preferably made of a material capable of elastic deformation in order to minimize damage to the wafer or ring carrier.

The wafer adsorption means 120 is configured to provide an adsorption force to a wafer disposed on the upper surface 101 so that the wafer may be temporarily fixed when the wafer is transferred by the transport hand 100. The wafer adsorption means 120 includes a first upper surface hole 121, a first lower surface hole 123 and a first passage 122.

The first upper surface hole 121 is a hole formed in the upper surface 101 of the transport hand 100, and the first lower surface hole 123 is a hole formed in the lower surface of the transport hand 100. The first passage 122 is a passage connecting the first upper surface hole 121 and the first lower surface hole 123. By the first passage 122, one airflow path following the order of the first upper surface hole 121, the first passage 122, and the first lower surface hole 123 is created.

The first upper surface hole 121 is formed in a portion where the support pad 110 is located, and a hole communicating with the first upper surface hole 121 is also formed in the support pad 110.

The ring carrier adsorption means 130 is configured to provide an adsorption force to a wafer disposed on the upper surface 101 so as to temporarily fix the ring carrier 200 used when a ring is transported by the transport hand 100. The ring carrier adsorption means 130 includes a second upper surface hole 131, a second lower surface hole 133 and a second passage 132.

The second upper surface hole 131 is a hole formed in the upper surface 101 of the transport hand 100, and the second lower surface hole 133 is a hole formed in the lower surface of the transport hand 100. The second passage 132 is a passage connecting the second upper surface hole 131 and the second lower surface hole 133. By the second passage 132, one airflow path following the order of the second upper surface hole 131, the second passage 132, and the second lower surface hole 133 is created.

The second upper surface hole 131 is foamed in a portion where the support pad 110 is located, and a hole communicating with the second upper surface hole 131 is also formed in the support pad 110.

The ring carrier adsorption means 130 is not for transporting wafers using the transport hand 100, but for providing an adsorption force to the ring carrier 200 for transporting a ring when transporting the ring. The adsorption force provided to the ring carrier is used to temporarily fix the ring in the process of finally transporting the ring.

Conventionally, temporary fixation between a ring and a ring carrier in the process of transporting the ring relied only on the frictional force between the ring support pad and the ring without a means for temporarily fixing the ring. On the contrary, in the present disclosure, a ring R may be more strongly coupled to the ring carrier 200 by the adsorption force provided by the ring carrier adsorption means 130, preventing the ring from being separated from the ring carrier in the process of transporting the ring.

Meanwhile, in the present disclosure, since the wafer adsorption means 120 and the ring carrier adsorption means 130 are separated, a suction force may be provided to the wafer adsorption means 120 when transporting a wafer, and a suction force may be provided to the ring carrier adsorption means 130 when transporting a ring. The path through which the suction force is provided selectively is determined as needed.

Hereinafter, a preferred embodiment of the second aspect of a ring transport system of the present disclosure will be described.

As shown in FIGS. 5 and 6, the ring transport system according to the preferred embodiment of the present disclosure includes a transport hand 100, a ring carrier 200, a transport arm A, and an air suction means.

The transport hand 100 has a plate-shaped configuration and includes an upper surface 101 and a lower surface. As shown in FIGS. 1 and 2, the transport hand 100 is provided with a support pad 110, a wafer adsorption means 120, and a ring carrier adsorption means 130. The upper surface 101 and the lower surface are not names that refer to the upper surface and the lower surface, respectively, as the meaning of the word implies. This is because the upper and lower surfaces may be different if the transport hand 100 is flipped. The upper surface 101 of the transport hand 100 is the surface in contact with a wafer or ring, and the lower surface is the surface opposite to the upper surface.

The support pad 110 is a friction member coupled to the upper surface 101 and in contact with the wafer or ring carrier. Since the support pad 110 is in direct contact with a wafer or ring carrier, the support pad 110 is preferably made of a material capable of elastic deformation in order to minimize damage to the wafer or ring carrier.

The wafer adsorption means 120 is configured to provide an adsorption force to a wafer disposed on the upper surface 101 so that the wafer may be temporarily fixed when the wafer is transferred by the transport hand 100. The wafer adsorption means 120 includes a first upper surface hole 121, a first lower surface hole 123 and a first passage 122.

The first upper surface hole 121 is a hole formed in the upper surface 101 of the transport hand 100, and the first lower surface hole 123 is a hole formed in the lower surface of the transport hand 100. The first passage 122 is a passage connecting the first upper surface hole 121 and the first lower surface hole 123. By the first passage 122, one airflow path following the order of the first upper surface hole 121, the first passage 122, and the first lower surface hole 123 is created.

The first upper surface hole 121 is formed in a portion where the support pad 110 is located, and a hole communicating with the first upper surface hole 121 is also formed in the support pad 110.

The ring carrier adsorption means 130 is configured to provide an adsorption force to a wafer disposed on the upper surface 101 so as to temporarily fix the ring carrier 200 used when a ring is transported by the transport hand 100. The ring carrier adsorption means 130 includes a second upper surface hole 131, a second lower surface hole 133 and a second passage 132.

The second upper surface hole 131 is a hole formed in the upper surface 101 of the transport hand 100, and the second lower surface hole 133 is a hole formed in the lower surface of the transport hand 100. The second passage 132 is a passage connecting the second upper surface hole 131 and the second lower surface hole 133. By the second passage 132, one airflow path following the order of the second upper surface hole 131, the second passage 132, and the second lower surface hole 133 is created.

The second upper surface hole 131 is foamed in a portion where the support pad 110 is located, and a hole communicating with the second upper surface hole 131 is also formed in the support pad 110.

The ring carrier 200 is configured in a disk shape, and the upper surface 201 thereof is in contact with a ring R while the lower surface thereof is in contact with the transport hand 100. Similar to the upper surface 101 and lower surface of the transport hand 100, the terms upper surface 201 and lower surface herein are defined by which surface is in contact with which configuration, and do not simply mean an upper surface or a lower surface.

As shown in FIGS. 3, 4A, and 4B, the ring carrier 200 includes a ring support pad 210, first vacuum hole 220, second vacuum hole 230, and carrier passage 240.

The ring support pad 210 is a friction member installed on the upper surface 201 of the ring carrier 200 and in direct contact with the ring R, and is preferably made of a material capable of elastic deformation in order to minimize damage to the ring R. The ring support pad 210 is provided at a portion where the first vacuum hole 220 is formed, and has a hole capable of communicating with the first vacuum hole 220.

The first vacuum hole 220 is a hole formed through the upper surface 201 of the ring carrier 200, and it is preferable that a plurality of the first vacuum holes 220 are provided. In this embodiment, three first vacuum holes 220 are provided, and a contained angle θ between the pair of first vacuum holes 220 adjacent to the center O of the ring carrier 200 is 120 degrees, which is a value obtained by dividing 360 by N, which is the number of first vacuum holes 220 (which is 3 in this embodiment).

Meanwhile, the first vacuum hole 220 is not necessarily provided in plural. Even if one first vacuum hole 220 is formed, strong coupling with the ring may be achieved by applying downward force to the ring by the adsorption force acting on the first vacuum hole 10. In addition, the frictional force may be defined as the product of the normal force and the coefficient of friction, and as the normal force between the ring support pad 210 and the ring R increases due to the downward force (adsorption force) acting on the ring, the frictional force between the ring support pad 210 and the ring R increases, and thus the effect of preventing separation of the ring R may be expected due to the increased frictional force. In short, even if only one first vacuum hole 220 is formed, the coupling force between the ring R and the ring carrier 200 is improved to prevent the ring R from being separated from the ring carrier 200 during the transport process of the ring R.

Of course, when there are several first vacuum holes 220, it is clear that there is an advantage in that the ring may be stably supported and stronger suction force may be provided compared to a case with one first vacuum hole 220. Thus, in this embodiment, three first vacuum holes 220 are provided.

Since the ring support pad 210 is in direct contact with the ring, the ring support pad 210 is disposed on the edge of the upper surface 201 of the ring carrier 200, and the first vacuum hole 220 is formed at a portion where the ring support pad 210 is installed. According to this configuration, there is an advantage in that the first vacuum holes 220 may make direct contact with the ring, so that a large adsorption effect may be produced.

The second vacuum hole 230 is a hole formed through the lower surface of the ring carrier 200 and is provided at a position communicating with the second upper surface hole 131 formed on the transport hand 100.

The carrier passage 240 is a tube connecting the first vacuum holes 220 and the second vacuum hole 230 to each other. The carrier passage 240 may be composed of tubes 240_a_, 240_b_, and 240_c_ connecting the second vacuum hole 230 and the individual first vacuum holes 220 as shown in FIG. 4A, or may include a first air passage 241 connecting the second vacuum hole 230 and any one first vacuum hole and a second air passage 242 formed in a circular shape along the rim of the ring carrier 200 to connect all of the first vacuum holes 220 as shown in FIG. 4B. Unlike the present embodiment, when there is only one first vacuum hole 220, only one tube connecting the first vacuum hole 220 and the second vacuum hole 230 needs to be installed.

When comparing the carrier passage 240 of the type shown in FIG. 4A and the carrier passage 240 of the type shown in FIG. 4B, it can be said that the effect is almost the same. Since the length of the carrier passage 240 is not several meters but several tens of centimeters, there is not a big difference in the distance the air travels by means of a vacuum pump (not shown), and thus almost the same effect occurs in both cases in that the first vacuum hole 220 may adsorb the ring R immediately when the vacuum pump is operated. Nevertheless, the carrier passage 240 shown in FIG. 4A is characterized by being shorter than the carrier passage 240 shown in FIG. 4B, whereas in the case of the carrier passage 240 shown in FIG. 4B, since the carrier passage 240 is provided over the entire rim of the ring carrier 200, when the first vacuum hole 220 is additionally formed, there is no need to additionally install the carrier passage 240.

The transport arm A is coupled with the transport hand 100 to drive the transport hand 100.

The air suction means is connected to the first lower surface hole 123 and the second lower surface hole 133 to suck air through the path of the first upper surface hole 121, the first passage 122, the first lower surface hole 123 or the path of the second upper surface hole 131, the second passage 132, and the second lower surface hole 133. The air suction means may include a suction passage 300 and vacuum pump (not shown).

As previously described, when the transport hand 100 transfers a wafer (not shown), air is sucked in through the path of the first upper surface hole 121, the first passage 122, the first lower surface hole 123, so that the wafer is temporarily fixed to the transport hand 100 by the adsorption force. As shown in FIG. 6, when the transport hand 100 transfers the ring R, air is sucked in through the path of the second upper surface hole 131, the second passage 132, and the second lower surface hole 133, so that the ring R is temporarily fixed to the ring carrier 200 by the suction force, preventing the ring R from being separated from the ring carrier 200 in the process of transporting the ring R.

In the above, specific details for carrying out the present disclosure have been provided by describing the preferred embodiments of the present disclosure. However, the technical spirit of the present disclosure is not limited to the described embodiments, and may be embodied in various forms within the scope not contrary to the technical spirit of the present disclosure.

What is claimed is:

1. A transport hand for a transport system in a shape of a plate having an upper surface in contact with a wafer or ring carrier to transfer the wafer or ring carrier, the transport hand comprising:

a support pad coupled to the upper surface to contact the wafer or ring carrier;

a wafer adsorption means configured to provide adsorption force to the wafer disposed on the upper surface, the wafer adsorption means comprising a first upper surface hole, which is a hole formed through the upper surface, a first lower surface hole formed through a lower surface opposite to the upper surface, and a first passage having a first end connected to the first upper surface hole and a second end connected to the first lower surface hole; and a ring carrier adsorption means configured to provide adsorption force to the ring carrier disposed on the upper surface, the ring carrier adsorption means comprising a second upper surface hole, which is a hole formed through the upper surface, a second lower surface hole formed through the lower surface opposite to the upper surface, and a second passage having a first end connected to the second upper surface hole and a second end connected to the second lower surface hole.

2. The transport hand of claim 1, wherein the support pad is installed in a portion where the first upper surface hole is located, and has a hole communicating with the first upper surface hole.

3. The transport hand of claim 1, wherein the support pad is installed in a portion where the second upper surface hole is located, and has a hole communicating with the second upper surface hole.

4. A ring transport system, comprising:

a transport hand for a transport system in a shape of a plate having an upper surface in contact with a wafer or ring carrier to transfer the wafer or ring carrier, wherein the transport hand includes:

a support pad coupled to the upper surface to contact the wafer or ring carrier, a wafer adsorption means configured to provide adsorption force to the wafer disposed on the upper surface, the wafer adsorption means comprising a first upper surface hole, which is a hole formed through the upper surface, a first lower surface hole formed through a lower surface opposite to the upper surface, and a first passage having a first end connected to the first upper surface hole and a second end connected to the first lower surface hole, and a ring carrier adsorption means configured to provide adsorption force to the ring carrier disposed on the upper surface, the ring carrier adsorption means comprising a second upper surface hole, which is a hole formed through the upper surface, a second lower surface hole formed through the lower surface opposite to the upper surface, and a second passage having a first end connected to the second upper surface hole and a second end connected to the second lower surface hole;

the ring carrier configured in a shape of a disk, and configured to have a lower surface in contact with the transport hand and an upper surface on which a ring support pad is installed to transport a ring while in contact with the ring by the ring support pad, the ring carrier comprising a first vacuum hole, which is a hole formed through the upper surface, a second vacuum hole, which is a hole formed through the lower surface, and a carrier passage connecting the first vacuum hole and the second vacuum hole to each other;

a transport arm configured to drive the transport hand; and an air suction means connected to the first lower surface hole and the second lower surface hole to suck air through a path of the first upper surface hole, first passage, and first lower surface hole or a path of the second upper surface hole, second passage, and second lower surface hole.

5. The ring transport system of claim 4, wherein the second vacuum hole is provided at a position capable of communicating with the second upper surface hole formed on the transport hand.

6. The ring transport system of claim 4, wherein the first vacuum hole comprises a plurality of first vacuum holes.

7. The ring transport system of claim 6, wherein the carrier passage comprises:

a first carrier passage connecting the second vacuum hole and any one of the first vacuum holes to each other; and a second carrier passage formed in a circular shape under a rim of the upper surface to connect all of the first vacuum holes to each other.

8. The ring transport system of claim 7, wherein when the number of the first vacuum holes is N, a contained angle between a pair of the first vacuum holes adjacent to a center of the upper surface is 360/N degrees.

9. The ring transport system of claim 7, wherein the ring support pad is installed in a portion where the first vacuum hole is located, and has a hole communicating with the first vacuum hole.

10. The ring transport system of claim 6, wherein the carrier passage connects the second vacuum hole and the individual first vacuum holes to each other.

11. The ring transport system of claim 10, wherein when the number of the first vacuum holes is N, a contained angle between a pair of the first vacuum holes adjacent to a center of the upper surface is 360/N degrees.

12. The ring transport system of claim 10, wherein the ring support pad is installed in a portion where the first vacuum hole is located, and has a hole communicating with the first vacuum hole.

13. The ring transport system of claim 6, wherein when the number of the first vacuum holes is N, a contained angle between a pair of the first vacuum holes adjacent to a center of the upper surface is 360/N degrees.

14. The ring transport system of claim 6, wherein the ring support pad is installed in a portion where the first vacuum hole is located, and has a hole communicating with the first vacuum hole.

15. The ring transport system of claim 6, wherein the support pad is installed in a portion where the first upper surface hole is located, and has a hole communicating with the first upper surface hole.

16. The ring transport system of claim 6, wherein the support pad is installed in a portion where the second upper surface hole is located, and has a hole communicating with the second upper surface hole.

17. The ring transport system of claim 4, wherein the ring support pad is installed in a portion where the first vacuum hole is located, and has a hole communicating with the first vacuum hole.

18. The ring transport system of claim 4, wherein the support pad is installed in a portion where the first upper surface hole is located, and has a hole communicating with the first upper surface hole.

19. The ring transport system of claim 4, wherein the support pad is installed in a portion where the second upper surface hole is located, and has a hole communicating with the second upper surface hole.

20. A ring transport system, comprising:

a transport hand for a transport system in a shape of a plate having an upper surface in contact with a wafer or ring carrier to transfer the wafer or ring carrier, wherein the transport hand includes:

a support pad coupled to the upper surface to contact the wafer or ring carrier, a wafer adsorption means configured to provide adsorption force to the wafer disposed on the upper surface, the wafer adsorption means comprising a first upper surface hole, which is a hole formed through the upper surface, a first lower surface hole formed through a lower surface opposite to the upper surface, and a first passage having a first end connected to the first upper surface hole and a second end connected to the first lower surface hole, and a ring carrier adsorption means configured to provide adsorption force to the ring carrier disposed on the upper surface, the ring carrier adsorption means comprising a second upper surface hole, which is a hole formed through the upper surface, a second lower surface hole formed through the lower surface opposite to the upper surface, and a second passage having a first end connected to the second upper surface hole and a second end connected to the second lower surface hole;

the ring carrier configured in a shape of a disk, and configured to have a lower surface in contact with the transport hand and an upper surface on which a ring support pad is installed to transport a ring while in contact with the ring by the ring support pad, the ring carrier comprising a first vacuum hole, which is a hole formed through the upper surface, a second vacuum hole, which is a hole formed through the lower surface, and a carrier passage connecting the first vacuum hole and the second vacuum hole to each other;

a transport arm configured to drive the transport hand; and an air suction means connected to the first lower surface hole and the second lower surface hole to suck air through a path of the first upper surface hole, first passage, and first lower surface hole or a path of the second upper surface hole, second passage, and second lower surface hole, wherein the first vacuum hole comprises a plurality of first vacuum holes, and when the number of the first vacuum holes is N, a contained angle between a pair of the first vacuum holes adjacent to a center of the upper surface is 360/N degrees, wherein the carrier passage comprises a first carrier passage connecting the second vacuum hole and any one of the first vacuum holes to each other, and a second carrier passage formed in a circular shape under a rim of the upper surface to connect all of the first vacuum holes to each other, and connects the second vacuum hole and the individual first vacuum holes to each other, wherein the ring support pad is installed in a portion where the first vacuum hole is located, and wherein the support pad is installed in a portion where the first upper surface hole or the second upper surface hole is located.

* * * * *